US006759171B1

(12) United States Patent
Kalk

(10) Patent No.: US 6,759,171 B1
(45) Date of Patent: Jul. 6, 2004

(54) ALTERNATING APERTURE PHASE SHIFTING PHOTOMASK WITH IMPROVED INTENSITY BALANCING

(75) Inventor: Franklin Dean Kalk, Austin, TX (US)

(73) Assignee: DuPont Photomasks, Inc., Round Rock, TX (US)

(*) Notice: Subject to any disclaimer, the term of this patent is extended or adjusted under 35 U.S.C. 154(b) by 163 days.

(21) Appl. No.: 10/044,732

(22) Filed: Jan. 11, 2002

Related U.S. Application Data

(60) Provisional application No. 60/261,041, filed on Jan. 11, 2001.

(51) Int. Cl.[7] ............................................. G03F 9/00
(52) U.S. Cl. ............................................................ 430/5
(58) Field of Search .......................... 430/5, 311, 313, 430/314, 322, 323, 324

(56) References Cited

U.S. PATENT DOCUMENTS

| 5,292,623 A | * | 3/1994 | Kemp et al. ............... 430/313 |
| 5,411,824 A | * | 5/1995 | Vasudev et al. ............... 430/5 |
| 5,437,947 A | * | 8/1995 | Hur et al. .................... 430/5 |

* cited by examiner

Primary Examiner—S. Rosasco
(74) Attorney, Agent, or Firm—Baker Botts L.L.P.

(57) ABSTRACT

The present disclosure includes describes a method for fabricating an AAPS photomask with improved intensity balance. The method includes forming an alternating aperture phase shifting photomask pattern on a substrate, including forming trenches within the substrate. The method further includes forming a layer of antireflective material within the bottom of at least one trench. In one embodiment the layer antireflective material is Magnesium Fluoride (MgF2) formed using a vacuum evaporation technique. The layer of antireflective material formed at the bottom of the trench areas increases the transmission of light through the trench areas by improving light coupling into the trench.

20 Claims, 3 Drawing Sheets

ALTERNATING APERTURE PHASE SHIFTING PHOTOMASK WITH IMPROVED INTENSITY BALANCING

CROSS REFERENCE TO RELATED APPLICATION

This application claims priority from U.S. Provisional Patent Application Serial No. 60/261,041, filed Jan. 11, 2001, and entitled "Alternating Aperture Phase Shifting Photomask with Improved Intensity Balance."

TECHNICAL FIELD OF THE INVENTION

This invention relates in general to the field of photolithography. In particular, the invention relates to photomasks used in photolithography and to methods for manufacturing and using such photomasks.

BACKGROUND OF THE INVENTION

A photolithography system typically uses a photomask, also known as a "mask" or "reticle," to transfer a pattern into a substrate. For example, manufacturers of integrated circuits (ICs) use photomasks as masters to optically transfer precision images from the photomasks onto semiconductor wafers. A photomask is a crucial component of a photolithography system because the photomask serves as the template that creates the image of a complex pattern, such as an integrated circuit layer, on a wafer.

To create a photomask, a photomask manufacturer may use a standard photolithography process, such as laser or electron beam lithography, to form the desired pattern on one surface of a high-purity quartz or glass plate, sometimes referred to as a "photomask blank" or "substrate". The photomask pattern is defined by areas that are covered by a chrome-based or other optical absorber and areas that are free of optical absorber. The former areas are referred to as chrome, dark, or opaque, while the latter are referred to as clear or glass. The pattern, sometimes referred to as the "geometry" or "image," may include millions of individual, microscopic features.

One particular type of photomask is known as an Alternating Aperture Phase Shifting (AAPS) photomask. The manufacture of AAPS masks includes etching alternating areas of transparent substrate (areas which are free of optical absorber) in order to form so-called "trenches" in the substrate. The trenches are preferably designed to cause a phase shift in the electromagnetic radiation (EMR) that passes through the photomask. Such a phase shift advantageously results in sharp edge definition and consequent resolution improvement.

One problem associated with AAPS masks results from diffraction effects. In general terms, as light passes through the trench at a non-normal angle, some of the light will be refracted outside of the trenched area. These diffraction effects cause less light to exit the etched trenches than that exiting the unetched area, resulting in an unwanted intensity imbalance. Such an imbalance decreases the effectiveness of the photomask and detracts from the improvements which motivate the use of AAPS photomasks.

SUMMARY OF THE INVENTION

Therefore, as recognized by the present invention, a need therefore exists for a way to decrease the intensity imbalance caused by diffraction effects associated with AAPS photomasks. In accordance with the teachings of the present invention, disadvantages and problems associated with diffraction effects in AAPS photomasks have been substantially reduced or eliminated.

In a particular embodiment, a method for fabricating an AAPS photomask with improved intensity balance is disclosed that includes the operation of forming an alternating aperture phase shifting photomask pattern on a substrate, including forming trenches within the substrate. The method further includes forming a layer of antireflective material within the bottom of at least one trench. More particularly, the method includes forming the layer of antireflective material from Magnesium Fluoride ($MgF_2$) or another material with a refractive index less than the refractive index of the substrate. Furthermore the antireflective layer may be formed using a vacuum evaporation technique. The layer of antireflective material formed at the bottom of the trench areas increases the transmission of light through the trench areas by improving light coupling into the trench. Another embodiment of the invention may include an enhanced AAPS photomask fabricated according to the above method.

A method for using a damage resistant photomask according to the present invention may be employed by a manufacturer of products such as integrated circuits. Such a method uses an enhanced AAPS photomask that features a pattern of opaque and clear areas and trenched areas layered with antireflective material. For instance, the manufacturer may project electromagnetic radiation through the clear areas and the protective layer of the photomask onto a wafer that has been coated with photoresist. The manufacturer may then develop the photoresist to leave a pattern of photoresist on the wafer that corresponds to the pattern of opaque and clear areas on the photomask.

The present invention included a number of important technical advantages. One important technical advantage; is forming a layer of antireflective material in the trenched areas of the AAPS photomask. The antireflective material decreases diffraction effects and aids in balancing transmission through etched and unetched areas of the AAPS photomask. Further advantages are described in the Claims, Figures, and Description below.

BRIEF DESCRIPTION OF THE DRAWINGS

A more complete understanding of the present invention and advantages thereof may be acquired by referring to the following description of various example embodiments, together with the accompanying drawings, in which.

DETAILED DESCRIPTION

Preferred embodiments of the present invention and their advantages may be better understood by reference to the example process and structures illustrated in FIGS. 1 through 6.

Figure 1:
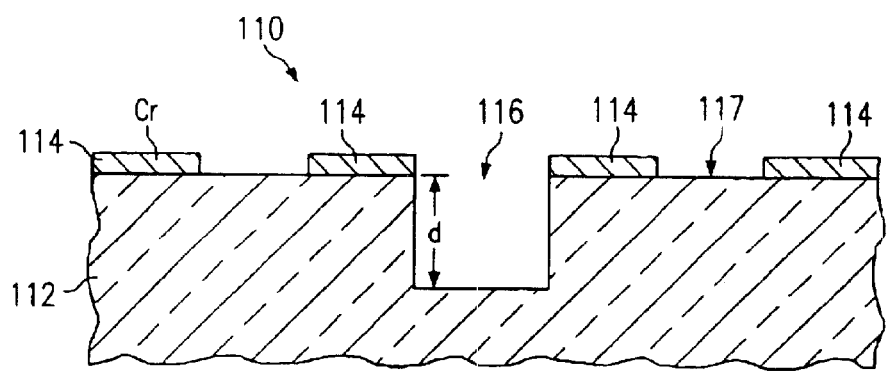
FIG. 1 illustrates a cross-sectional view of an AAPS photomask.

FIG. 1 illustrates a cross-sectional side view of a photomask 110, with portions broken away, according to a first example embodiment of an AAPS photomask. In this embodiment, photomask 110 (otherwise known as a "mask" or "reticle") includes a substrate 112, and a pattern of optical absorbers 114. A trench 116 with a depth (d) has been preferably etched into substrate 112. Additionally, in this preferred example, neighboring areas of substrate 112 have not been etched. Optical absorbers 114 may preferably form a pattern on a surface of photomask 110. For example, the image may correspond to a layer of an integrated circuit, for use in manufacturing integrated circuits.

Figure 2:
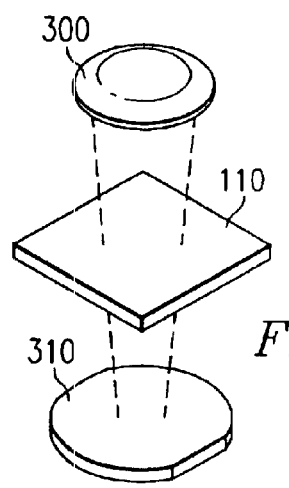
FIG. 2 presents an isometric view of an example lithography system using an AAPS photomask to produce an image on a wafer.

FIG. 2 depicts a lithography system in which a lamp 300 projects electromagnetic radiation (EMR) through photomask 110 to reproduce the photomask pattern on a surface of a silicon wafer 310. In a preferred embodiment, photomask 110 may be enhanced in accordance with the present invention and be used in place of a conventional photomask in an otherwise conventional lithography system.

Figure 3:
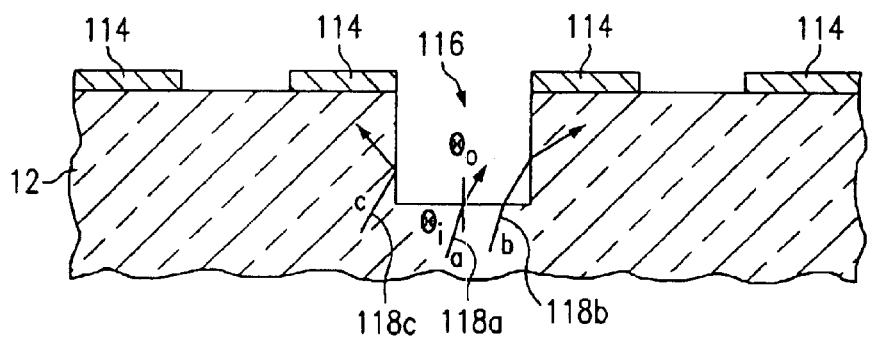
FIG. 3 illustrates a cross-sectional view of an AAPS photomask demonstrating diffraction effects.

FIG. 3 illustrates diffractive effects of light passing through trench 116. Light rays 118a, b, and c enter trench 116 at non-normal angles. FIG. 3 demonstrates that light rays incident on trench 116 at non-normal angles are partially attenuated because some of the light rays will not enter trench 116 and some of the light rays will exit the trench before reaching the upper plane of substrate 112.

Diffraction effects in the etched region cause less light to exit the etched trench than that exiting the unetched area (when the two features have the same width). For example, for a 248 nm wavelength light source and a 0.6 NA and 4× reduction imaging, approximately 10–15% of light may be lost for a nominal 520 nm mask size feature (130 nm feature on the wafer).

In the present embodiment, Ray 118a enters trench 116 at angle 0 to the normal of trench 116 base. Ray 118b takes a similar path, impinging on the sidewall of trench 116 and is refracted back into substrate 112. Ray 118c impinges on the side wall of trench 116 and is internally reflected into substrate 112. The angular displacement of Rays 118a–c is governed by Snell's law and is accordingly effected by the angle of incidence of each ray of light as well as the refractive index of substrate 112 and the adjoining material or fluid.

Figure 4:
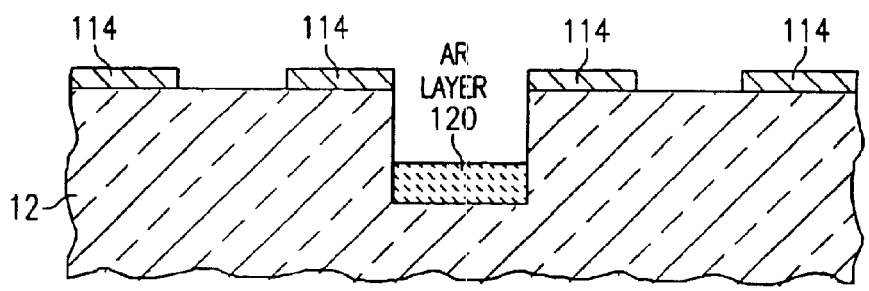
FIG. 4 illustrates a cross-sectional view of an AAPS photomask with an antireflective coating deposited in the etched trench.

FIG. 4 illustrates an AAPS photomask according to the present invention. Photomask 110 includes substrate 112 with optical absorbers 114 patterned thereon. Trench 116 has preferably been etched within substrate 112. Finally, antireflective (AR) layer 120 has preferably been deposited within trench 116.

As shown, photomask 110 is substantially rectangular in one example embodiment. However, alternative photomask embodiments according to the invention may have a variety of sizes and shapes, including but not limited to round or square shapes. Photomasks according to the invention may also be any variety of photomask types, including, but not limited to, a one-time master, a five-inch reticle, a six-inch reticle or any other size reticle suitable to project an image of a pattern (e.g., a circuit layer) onto an object substrate (e.g., a silicon wafer).

For some applications, the substrate may be a transparent material such as quartz, synthetic quartz, fused silica, magnesium fluoride ($MgF_2$), calcium fluoride ($CaF_2$), or any other suitable material. For instance, the substrates for some applications may transmit approximately ninety-nine percent of incident light having a wavelength between approximately 120 nanometers (nm) and approximately 450 nm.

In the example embodiment, optical absorber 118 may be chrome and may be referred to generally as "absorber." For some applications, the optical absorbers may be chrome, chromium nitride, a metallic oxy-carbo-nitride (e.g., MOCN, where M is selected from the group consisting of chromium, cobalt, iron, zinc, molybdenum, niobium, tantalum, titanium, tungsten, aluminum, magnesium, and silicon), or any other suitable material. For some applications, the optical absorbers may be a material that absorbs light with wavelengths between approximately 120 nm and approximately 450 nm. In some embodiments, the optical absorbers may be a partially transmissive material, such as molybdenum silicide (MoSi), which has a transmissivity of approximately one percent to approximately thirty percent.

In typical AAPS photomasks, the depth of trench 116 is governed by the equation:

$$d = \frac{0.5\lambda}{n-1}$$

where d is the trench depth, n is the refractive index of substrate 112 and is the wavelength of light entering the substrate. The trench depth is preferably selected to enable light transiting the etched (trench) regions of photomask 110 to lead the light transiting the unetched regions of photomask 110. In one example embodiment, for a 248 nm wavelength and a refractive index of 1.475 (for fused silica), the required trench depth is approximately 261 nm.

In the preferred present embodiment, the thickness of antireflective material layer 120 is governed by the equation:

$$d_{AR} = \frac{\lambda}{4n_{AR}}$$

Where $d_{AR}$ is the depth of antireflective layer 120 and $n_{AR}$ is the refractive index of the AR material. Because the inclusion of AR layer 120 partially fills in the trench, the initial trench depth, (as shown in FIG. 1) may be governed by the equation:

$$n_{substrate} \cdot d - n_{air} \cdot (d - d_{AR}) - n_{AR} \cdot d_{AR} = 0.5\pi$$

For example, using a wavelength of 248 nm and refractive indices of quartz and the AR layer of 1.47 and 1.40, the corresponding depth of the AR layer is approximately 44.3 nm and the depth of the trench d, prior to deposition of the AR layer, is approximately 298 nm.

In the present embodiment, AR layer 120 is preferably formed from Magnesium Fluoride ($MgF_2$) or another suitable AR material. Further, AR layer 120 may preferably be deposited by vacuum evaporation or another suitable technique.

After AR layer 120 has been formed, the AAPS photomask may be completed by attaching a protective pellicle. Additionally, a protective layer may be formed prior to attaching the pellicle, in order to provide protection against electrostatic discharge (ESD). As described in greater detail below with reference to FIGS. 5A–5J, a photolithography process may be used to fabricate photomask 110. Such a process typically includes the operations of exposing particular areas of a photoresist layer on a photomask blank, developing the photoresist to create a pattern, etching the regions of an opaque layer not covered by photoresist, and then removing the remaining photoresist to leave a patterned opaque layer over a transparent substrate. The pattern may be based on an original photomask pattern data file that has been derived from a circuit design pattern. The desired pattern may be imaged on the photomask blank using a laser, electron beam, or X-ray lithography tool. For instance, the lithography tool may use an argon-ion laser that emits light having a wavelength of approximately 364 nanometers (nm), for example. Alternative lithography tools may use lasers emitting light at wavelengths from approximately 150 nm to approximately 300 nm, for example.

FIGS. 5A–5J depict a cross section of a portion of a photomask according to the present invention. Specifically, FIGS. 5A–5J illustrate various stages in the fabrication process that culminates when an AAPS photomask assembly is completed. The flowchart of FIG. 6 describes steps in the example process for fabricating the enhanced AAPS mask.

Figure 5A:
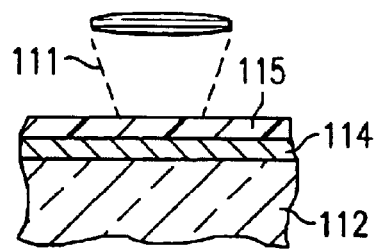
FIGS. 5A–5J are schematic drawings with portions broken away showing cross-sectional side views at various stages of manufacturing an AAPS photomask in accordance with teachings of the present invention.
Figure 6:
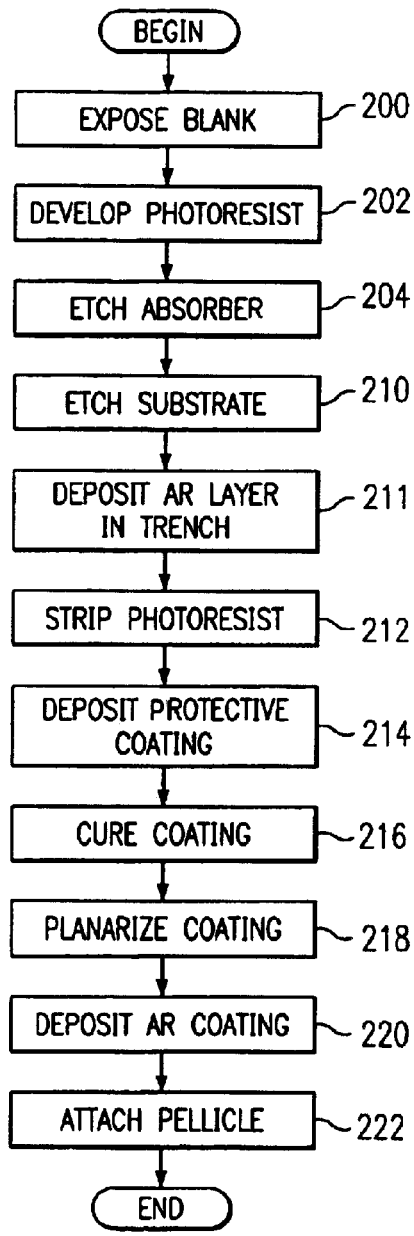
FIG. 6 presents an example method for fabricating photomasks according to the invention.

Referring now to block 200 of FIG. 6, the example process begins with the photomask manufacturer exposing a pattern onto a photomask blank. As illustrated in FIG. 5A, the photomask blank includes a transparent substrate 112, a layer of optical absorber 114 that coats a surface of transparent substrate 112, and a layer of photoresist 115 that coats optical absorber 114. The photomask manufacturer may expose the pattern in photoresist 115 using an electron beam or laser beam 113, for instance.

Figure 5B:
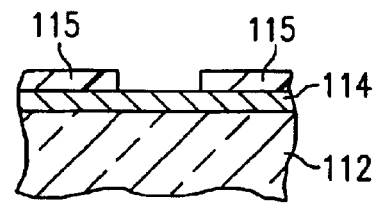
Figure 5C:
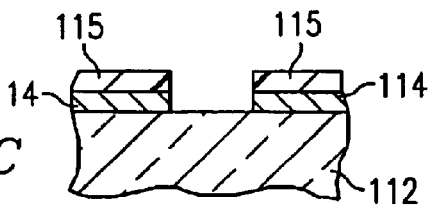

As depicted in block 202 and FIG. 5B, photoresist 115 is then developed, which causes portions of photoresist 115 to be removed according to the pattern exposed in the previous step. In the example embodiment of FIGS. 5A–5J a positive resist process is used, in which a developer dissolves the areas of photoresist 115 that have been exposed, to uncover regions of optical absorber 114 formed on transparent substrate 112. However, negative photoresist may be used in alternative embodiments. As shown in block 204 and FIG. 5C, the manufacturer then etches away optical absorber 114 in the areas that have been cleared of photoresist 115 to expose areas of transparent substrate 112.

Figure 5D:
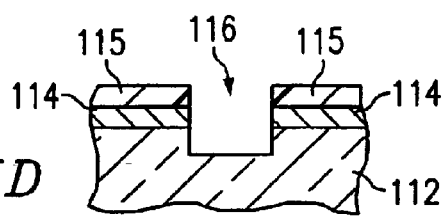

As shown in block 210 and FIG. 5D, the manufacturer may etch exposed areas of a transparent substrate 112 to form trenches, such as trench 116. The depth of trench 116 is selected according to the criteria described above. A plasma etcher (not expressly shown) may be used to form the trenches.

Figure 5E:
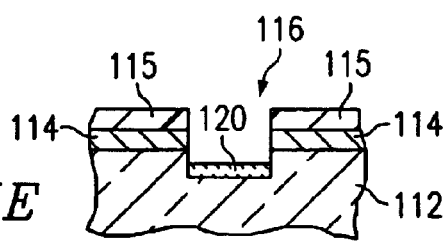

After optical absorber 114 and substrate 112 have been etched, AR layer 120 is preferably deposited in trench 116 as shown in FIG. 5E and block 211. In a preferred embodiment, AR layer 120 may be a layer of Magnesium Fluoride (MgF$_2$) deposited via vacuum evaporation or another suitable technique. The thickness of AR layer 120 is preferably selected as described in FIG. 4, above.

Figure 5F:
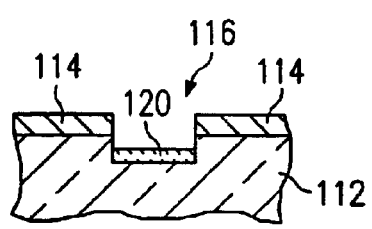

After AR layer 120 is deposited, photoresist 115 is stripped from the patterned blank, as shown in FIG. 5F and in block 212 of FIG. 6. At this point, the photomask may be referred to as a "patterned substrate." Also, the process of etching absorber 114 and substrate 112, may be referred to as "patterning" the mask.

Figure 5G:
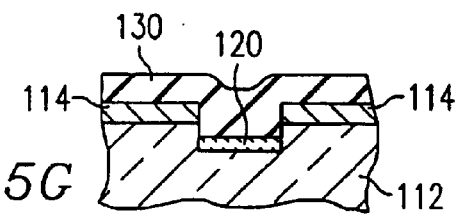

As depicted in FIG. 5G, the photomask manufacturer may form one or more layers of protective coating 130 on the patterned substrate to protect against electrostatic discharge. In the example process, protective coating 130 is a transparent, dielectric material, (e.g., spin-on glass). Further, it may be preferable to use a coating with a higher refractive index. For instance, a protective coating composed of sputter-deposited hafnium oxide (HfO$_2$) may be used. Hafnium oxide has a refractive index of approximately 2.25 at 248 nm, a wavelength typically used in semiconductor lithography. In alternative embodiments, however, other types of coatings may be used, including, but not limited to, aluminum oxide (Al$_2$O$_3$), aluminum nitride (AlN), silicon nitride (Si$_3$N$_4$), tantalum oxide (Ta$_2$O$_5$), yttrium oxide (Y$_2$O$_3$), magnesium fluoride (MgF$_2$), magnesium oxide (MgO), zirconium oxide (ZrO$_2$), lithium fluoride (LiF), aluminum fluoride (AlF$_3$), calcium fluoride (CaF$_2$), and indium-tin oxide (i.e., indium oxide doped with tin oxide; also known as "ITO").

Protective coating 130 may be formed by using a standard spin coater to deposit a spin-on glass solution onto the patterned substrate and then curing the solution on the photomask, for example by baking, firing, or electron beam curing, as depicted in blocks 214 and 216 of FIG. 6. Protective coating 130 may also be referred to as "protective material" or a "protective layer" 130, and protective layer 130 protects optical absorber 114 from damage during processes such as photomask cleaning, for example. Furthermore, protective layer 130 may be deposited by a method other than spin-on glass, such as magnetron sputtering, thermal or electron beam evaporation, chemical vapor deposition, or ion beam sputtering.

Figure 5H:
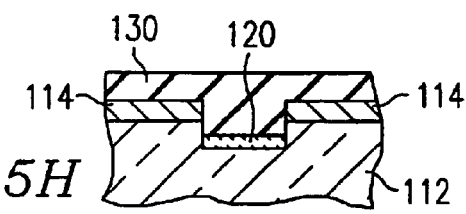

Once coated with protective layer 130, photomask 110 may then be cleaned, inspected, and shipped to a customer for use in fabricating integrated circuits, for example. Alternatively, one or more additional, optional steps may be performed in the fabrication process. For instance, depending on factors such as the conformality of protective coating 130 and the sizes of the features in the mask pattern, dimples may have formed in protective coating 130, as depicted in FIG. 5G. In such cases, it may be desirable to smooth or planarize the surface of protective coating 130, as shown in FIG. 5H and in block 218 of FIG. 6. For instance, chemical mechanical polishing (CMP) may be used to produce a flat or substantially flat surface on protective layer 130.

Figure 5I:
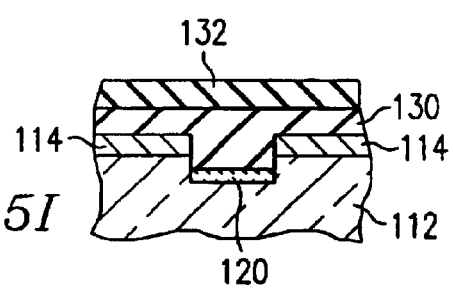

As depicted at block 220 of FIG. 6 and in FIG. 5I, it may also be desirable to apply an antireflective (AR) coating 132 onto protective layer 130 to increase the percentage of EMR transmitted through protective layer 130. In the example embodiments, magnesium fluoride (MgF$_2$) is used as AR coating 132, but other materials (e.g., aluminum fluoride (AlF$_3$)) may be used in alternative embodiments.

Figure 5J:
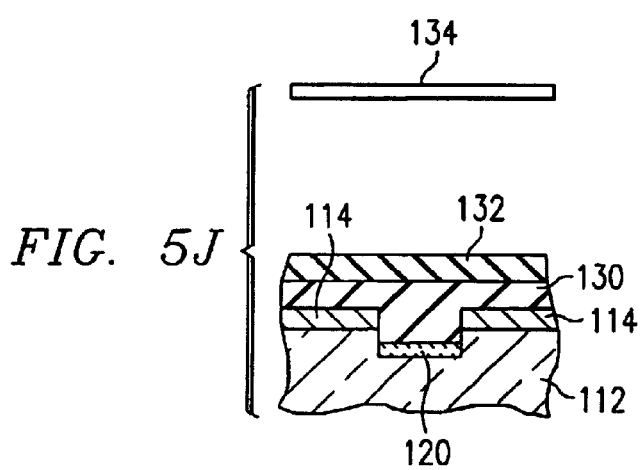

In addition, as shown in block 222 of FIG. 6 and in FIG. 5J, the manufacturer may attach a pellicle to the photomask before shipping the photomask to the customer. The pellicle may include a pellicle membrane 134 that is suspended a certain distance above protective layer 130 and AR layer 132 by a pellicle frame, so that if any dirt (e.g., dust particles) sticks to pellicle membrane 134, those particles will be out of focus with respect to the image that the photomask produces on an object substrate when the photomask is transilluminated. Pellicle membrane 134 may also provide additional protection against pattern damage.

For some applications, transparent substrate 112 may be approximately 6.35 millimeters (mm) thick, chrome 114 may be approximately 100 nm thick, protective layer 130 may be approximately 200 nm thick, and AR coating 132 may be approximately 45 nm deep. Also, pellicle membrane 134 may be suspended approximately 7 mm above the surface of chrome 114. The exact thickness and heights of the various components, including trench 116 and AR layer 120 will depend on the optical properties of the materials used. Furthermore, different measurements may be used for many or all of those components in alternative embodiments.

Although various example embodiments of the invention have been described in detail, it should be understood that various changes and substitutions can be made without departing from the spirit and scope of the invention. For example, the additional layers may be provided on the photomask. Also, additional operations for creating trenches in the mask may include stripping and re-coating the mask with photoresist, writing or imaging the new photoresist, and developing the photoresist to expose the areas of transparent substrate 112 to be trenched. Myriad additional variations will be apparent to those of ordinary skill in the art. It should therefore be understood that the invention is not limited to the illustrated embodiments, but is defined by the appended claims.

What is claimed is:

1. A method for fabricating an intensity balanced photomask, the method comprising:

forming an alternating aperture phase shifting photomask pattern on a substrate having trenches formed therein; and forming a layer of antireflective material within the bottom of at least one trench, the antireflective material substantially transparent to at least one wavelength.

2. The method of claim 1 wherein the antireflective material further comprises Magnesium Fluoride ($MgF_2$).

3. The method of claim 1 further comprising forming a layer of antireflective material within the bottom of a plurality of the trenches.

4. The method of claim 1 further comprising forming the layer of antireflective material using a vacuum evaporation technique.

5. The method of claim 1 further comprising selecting the depth of the antireflective layer to increase light coupling into the trench.

6. The method of claim 1 further comprising:

selecting a light source having a wavelength for use with the photomask; and selecting an AR layer thickness of approximately the wavelength divided by four times the refractive index of the antireflective material.

7. The method of claim 6 further comprising selecting an AR layer thickness equal to the wavelength divided by four times the refractive index of the antireflective material.

8. The method of claim 1 further comprising the substrate formed from quartz.

9. The method of claim 1 further comprising depositing an absorber layer on the alternating aperture phase shifting photomask pattern.

10. The method of claim 1 further comprising depositing a protective layer over the photomask to prevent electrostatic discharge.

11. A method for fabricating a phase shifting mask, the method comprising:

providing an etched transparent substrate having a recessed transmissive area, the substrate having a first refractive index;

depositing a transparent antireflective layer in the recessed transmissive area, the antireflective layer having a second refractive index less than the first refractive index;

depositing an absorber layer on the etched substrate; and patterning the absorber layer.

12. The method of claim 11, wherein the antireflective layer has a thickness of approximately one-quarter of a wavelength of incident light.

13. The method of claim 11, wherein the antireflective comprises Magnesium Fluoride ($MgF_2$).

14. An alternating aperture phase shifting photomask, comprising:

an etched transparent substrate including a recessed transmissive portion;

an antireflective layer deposited on a bottom surface of the recessed transmissive portion, the antireflective layer substantially transparent to at least one wavelength; and a patterned absorber layer deposited on the substrate.

15. The phase shifting mask of claim 14 further comprising the antireflective layer having a thickness of approximately one-quarter wavelength of incident light.

16. The phase shifting mask of claim 14 further comprising the antireflective layer having a thickness of approximately the wavelength of incident light divided by four times the refractive index of the antireflective layer.

17. The phase shifting mask of claim 14, wherein the substrate has a first refractive index and the antireflective layer has a second refractive index less than the first refractive index.

18. The phase shifting mask of claim 14, wherein the antireflective layer comprises Magnesium Fluoride ($MgF_2$).

19. The phase shifting mask of claim 14 further comprising the antireflective layer deposited using a directional technique.

20. The phase shifting mask of claim 14 further comprising the antireflective layer deposited using a vacuum evaporation technique.

* * * * *